(12) United States Patent
Tanie et al.

(10) Patent No.: US 11,088,042 B2
(45) Date of Patent: Aug. 10, 2021

(54) SEMICONDUCTOR DEVICE AND PRODUCTION METHOD THEREFOR

(71) Applicant: HITACHI METALS, LTD., Tokyo (JP)

(72) Inventors: Hisashi Tanie, Tokyo (JP); Hiromi Shimazu, Tokyo (JP); Hiroyuki Ito, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 58 days.

(21) Appl. No.: 16/612,832

(22) PCT Filed: Jul. 2, 2018

(86) PCT No.: PCT/JP2018/025007
§ 371 (c)(1),
(2) Date: Nov. 12, 2019

(87) PCT Pub. No.: WO2019/064775
PCT Pub. Date: Apr. 4, 2019

(65) Prior Publication Data
US 2020/0203241 A1 Jun. 25, 2020

(30) Foreign Application Priority Data
Sep. 29, 2017 (JP) .............................. JP2017-189667

(51) Int. Cl.
*H01L 23/12* (2006.01)
*H01L 23/36* (2006.01)
(Continued)

(52) U.S. Cl.
CPC .............. *H01L 23/12* (2013.01); *H01L 21/52* (2013.01); *H01L 23/36* (2013.01); *H01L 24/29* (2013.01);
(Continued)

(58) Field of Classification Search
CPC ..... H01L 23/12; H01L 23/36; H01L 23/3735; H01L 23/5385; H01L 24/29; H01L 24/83;
(Continued)

(56) References Cited

U.S. PATENT DOCUMENTS 4,675,243 A * 6/1987 Obinata ............ H01L 23/49866
428/210
4,998,159 A * 3/1991 Shinohara ............. C04B 35/645
361/809
(Continued)

FOREIGN PATENT DOCUMENTS

JP 2012-033664 A 2/2012

*Primary Examiner* — Mohsen Ahmadi
(74) *Attorney, Agent, or Firm* — Volpe Koenig

(57) ABSTRACT

The objective of the present invention is to provide a technique that ensures conduction between a gate terminal of a semiconductor switching element and a wiring layer in a semiconductor device formed with a wiring layer inside a ceramic layer. This semiconductor device comprises: a wiring layer that is inside a ceramic layer formed above an insulation layer; and a metal layer for connecting terminals from the semiconductor switching element other than the gate terminal. The wiring layer and the gate terminal from the semiconductor switching element are connected electrically via a connection part formed from a conductive material. The connection part protrudes more than the metal layer toward the semiconductor switching element.

12 Claims, 11 Drawing Sheets sectional view A-A

(51) Int. Cl.
*H01L 23/00* (2006.01)
*H01L 23/373* (2006.01)
*H01L 25/07* (2006.01)
*H01L 25/18* (2006.01)
*H01L 25/00* (2006.01)
*H01L 21/52* (2006.01)
*H01L 23/538* (2006.01)

(52) U.S. Cl.
CPC ............ *H01L 24/83* (2013.01); *H01L 25/072* (2013.01); *H01L 25/18* (2013.01); *H01L 25/50* (2013.01); *H01L 23/3735* (2013.01); *H01L 23/5385* (2013.01); *H01L 2224/8384* (2013.01); *H01L 2224/83095* (2013.01); *H01L 2924/3511* (2013.01)

(58) Field of Classification Search
CPC ......... H01L 25/072; H01L 2224/83095; H01L 2224/8384
See application file for complete search history.

(56) References Cited

U.S. PATENT DOCUMENTS

2013/0182397 A1* 7/2013 Abe ..................... H05K 3/4629
361/748
2014/0252576 A1* 9/2014 Tanie ..................... H01L 21/52
257/669

* cited by examiner sectional view A-A sectional view A-A sectional view A-A sectional view A-A

SEMICONDUCTOR DEVICE AND PRODUCTION METHOD THEREFOR

TECHNICAL FIELD

The present disclosure relates to a power semiconductor device and a manufacturing method therefor.

BACKGROUND ART

Various machines are under development for electrically-driven in recent years. Power modules, that control rectification of alternative and direct currents with large electrical power at several kilovolts or several hundred amperes driving the machines, and that control rotational speeds of AC motors, are required to be miniaturized, to be highly functionalized, and to be highly reliable. When a power module operates, semiconductor chips equipped in the module produce heat. Thus it is necessary to increase heat dissipation ability when miniaturizing the module. In addition, semiconductor chips operate at high voltage of several kilovolts. Thus it is necessary to ensure insulation from external environments. Further, in order to effectively control semiconductor chips, it is necessary to equip a control circuit that has high degree of freedom in design or manufacturing process.

Patent Literature 1 listed below discloses a technique related to the above-described technical problem. In the literature: a non-sintered green sheet of Low Temperature Co-fired Ceramics (LTCC) is stacked on a sintered ceramic substrate; the stack is sintered to produce a composite ceramic substrate; electronic components such as capacitors or IC chips are implemented on the composite ceramic substrate, thereby constructing a module.

CITATION LIST

Patent Literature

Patent Literature 1: JP Patent Publication 2012-033664 A

SUMMARY OF INVENTION

Technical Problem

Using a control signal circuit layer formed of a wire and ceramic, and also using a ceramic substrate including a circuit layer formed of metal, it is possible to construct a power module by forming a gate circuit with a wire layer of the control signal circuit layer and by forming an emitter circuit or a collector circuit with a thick metal layer for circuit. In order to operate such power modules with high reliability, it is necessary to ensure electrical conductivity between semiconductor chips and circuits of the power module. In other words, it is necessary to ensure conductivity between the gate terminal of the semiconductor chip and a wire layer of the control signal circuit, and it is also necessary to ensure conductivity between the emitter terminal or the collector terminal and the metal circuit layer. The gate terminal of the semiconductor chip has an area size smaller than that of the emitter terminal or that of the collector terminal. Thus in terms of positional alignment or thermal deformation after bonding, it is more difficult to ensure conductivity of the gate terminal than that of the emitter or collector terminals. In addition, the control signal circuit layer made of ceramic has a thermal conductivity smaller than that of the circuit layer made of metal.

The present disclosure has been made in view of the problems above. An objective of the present disclosure is to provide a semiconductor device in which a wire layer is formed in a ceramic layer, the semiconductor device being capable of ensuring conductivity between a gate terminal of a semiconductor switching element and the wire layer as well as being capable of ensuring heat dissipation, thereby achieving both high heat dissipation and high reliability.

Solution to Problem

A semiconductor device according to the present disclosure includes: a wire layer within a ceramic layer formed on an insulation layer; and a metal layer that connects a terminal other than a gate terminal of a semiconductor switching element, wherein the gate terminal of the semiconductor switching element and the wire layer are electrically connected with each other via a connection portion formed of conductive material, and wherein the connection portion is protruded more than the metal layer toward the semiconductor switching element.

Advantageous Effects of Invention

According to the semiconductor device of the present disclosure, it is possible to ensure conductivity between a gate terminal of a semiconductor switching element and a wire layer as well as to ensure heat dissipation, thereby achieving both high heat dissipation and high reliability.

DESCRIPTION OF EMBODIMENTS

Embodiment 1

Figure 1:
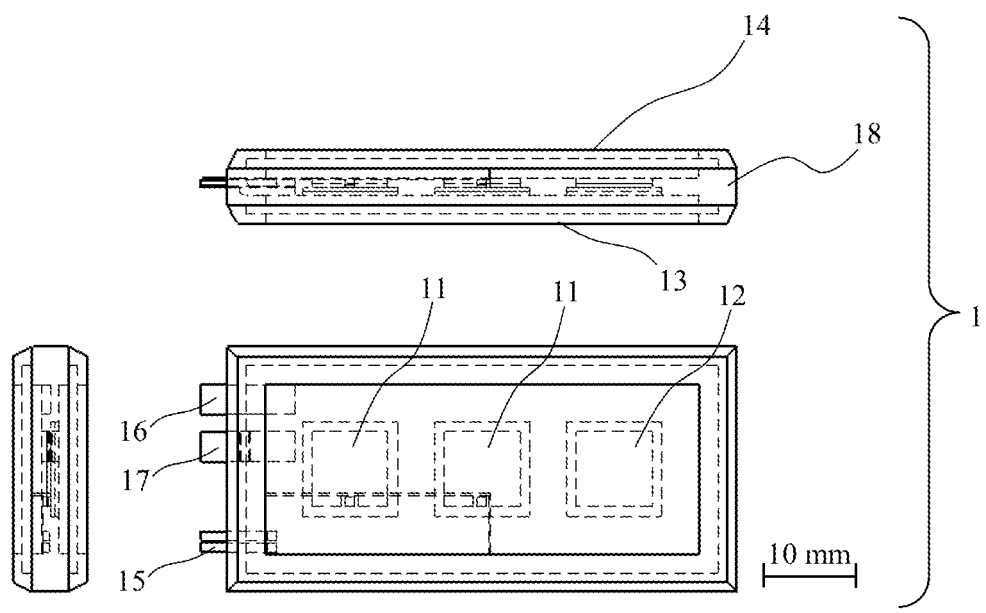
FIG. 1 is a configuration diagram of a semiconductor device 1 according to an embodiment 1.
Figure 1:
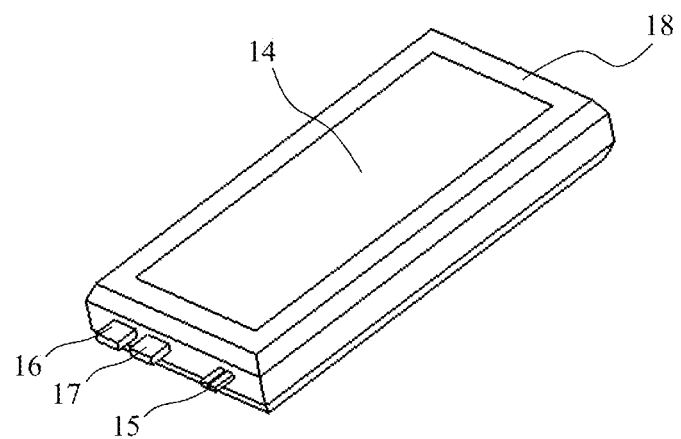

FIG. 1 is a configuration diagram of a semiconductor device 1 according to an embodiment 1 of the present disclosure. The semiconductor device 1 includes, within the device itself, an IGBT (Insulated Gate Bipolar Transistor) chip 11 and a diode chip 12. A gate terminal 15 for external leading, an emitter terminal 16 for external leading, and a collector terminal 17 for external leading are led from the semiconductor device 1, so that the semiconductor device 1 is capable of working as a part of an inverter circuit. This diagram shows an example where two IGBT chips 11 and a diode chip 12 are disposed inside the semiconductor device 1.

A second insulation substrate 14, which is provided for emitter and gate terminals, is located on a surface of the semiconductor device 1. A first insulation substrate 13, which is provided for the collector terminal, is located on another surface of the semiconductor device 1. The heat generated when the semiconductor chip works is dissipated from both sides of the semiconductor device 1. The IGBT chip 11, the diode chip 12, the second insulation substrate 14, and the first insulation substrate 13 are molded by a mold resin 18. It ensures insulation and reliability. A highly heat-resisting epoxy resin is employed for the mold resin 18 in this embodiment.

Figure 2:
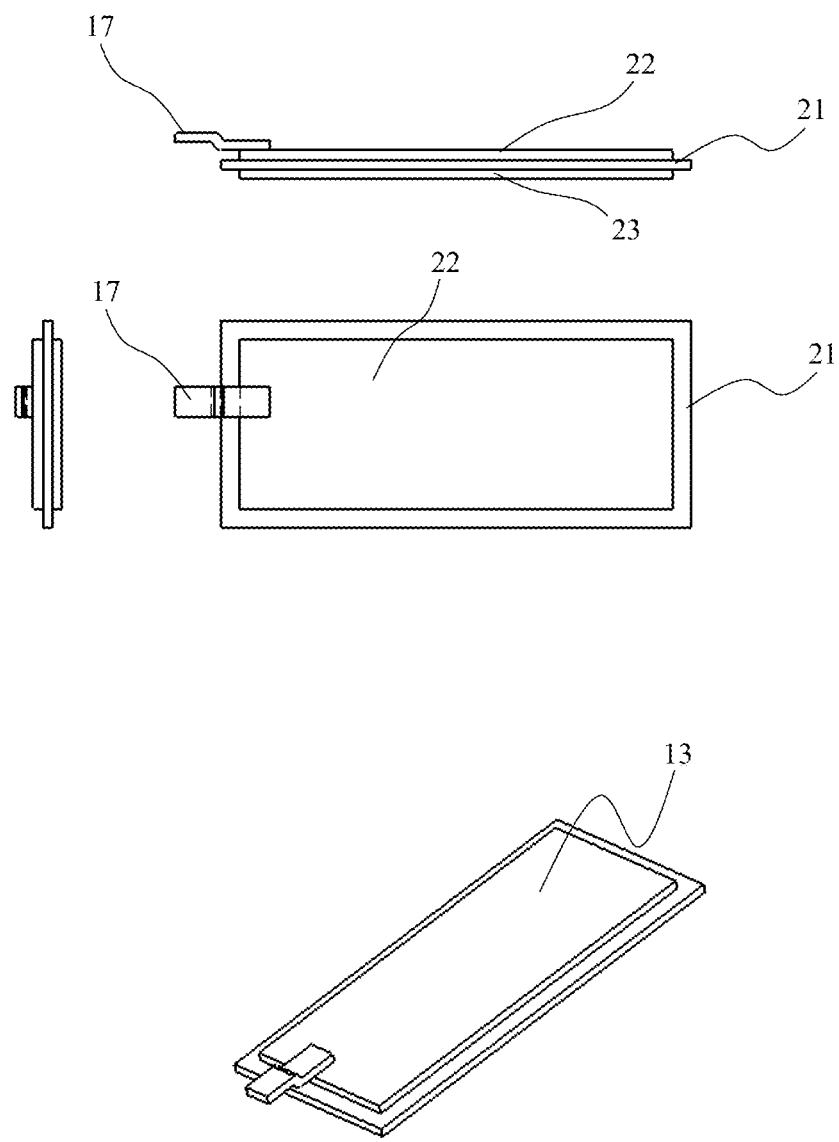
FIG. 2 is a configuration diagram of a first insulation substrate 13.

FIG. 2 is a configuration diagram of the first insulation substrate 13. The first insulation substrate 13 provided for the collector terminal includes an insulation layer 21. A circuit layer 22, which is made as a metal layer, is located on a surface of the insulation layer 21. A heat dissipation layer 23 is located on another surface of the insulation layer 21. The collector terminal 17 for external leading is connected to the circuit layer 22. The semiconductor device 1 is electrically connected to external devices via the collector terminal 17. A ceramic material made of silicon nitride is employed as the insulation layer 21 in the embodiment 1. This material is excellent in insulation and thermal conductivity, as well as having high strength. Thus this material is employed in terms of heat dissipation and reliability. Other ceramics such as alumina or aluminum nitride may be employed depending on application or operating environment of the semiconductor device 1. Copper is used as the circuit layer 22, the heat dissipation layer 23, and the collector terminal 17 for external leading. This is because copper is excellent in electrical conductivity and thermal conductivity. Other metal material such as aluminum may be employed depending on application or operating environment of the semiconductor device 1. The surface of the heat dissipation layer 23 has a smooth shape in this embodiment. This is for facilitating connection to cooling fin or the like when using the semiconductor device 1. On the other hand, the heat dissipation layer 23 itself may be used as a cooling fin by providing a fin on the surface of the heat dissipation layer 23. Although it is necessary to provide a fin in such case, there is no increase in thermal resistance due to connection members between the heat dissipation layer 23 and the cooling fin, thereby improving heat dissipation.

Figure 3:
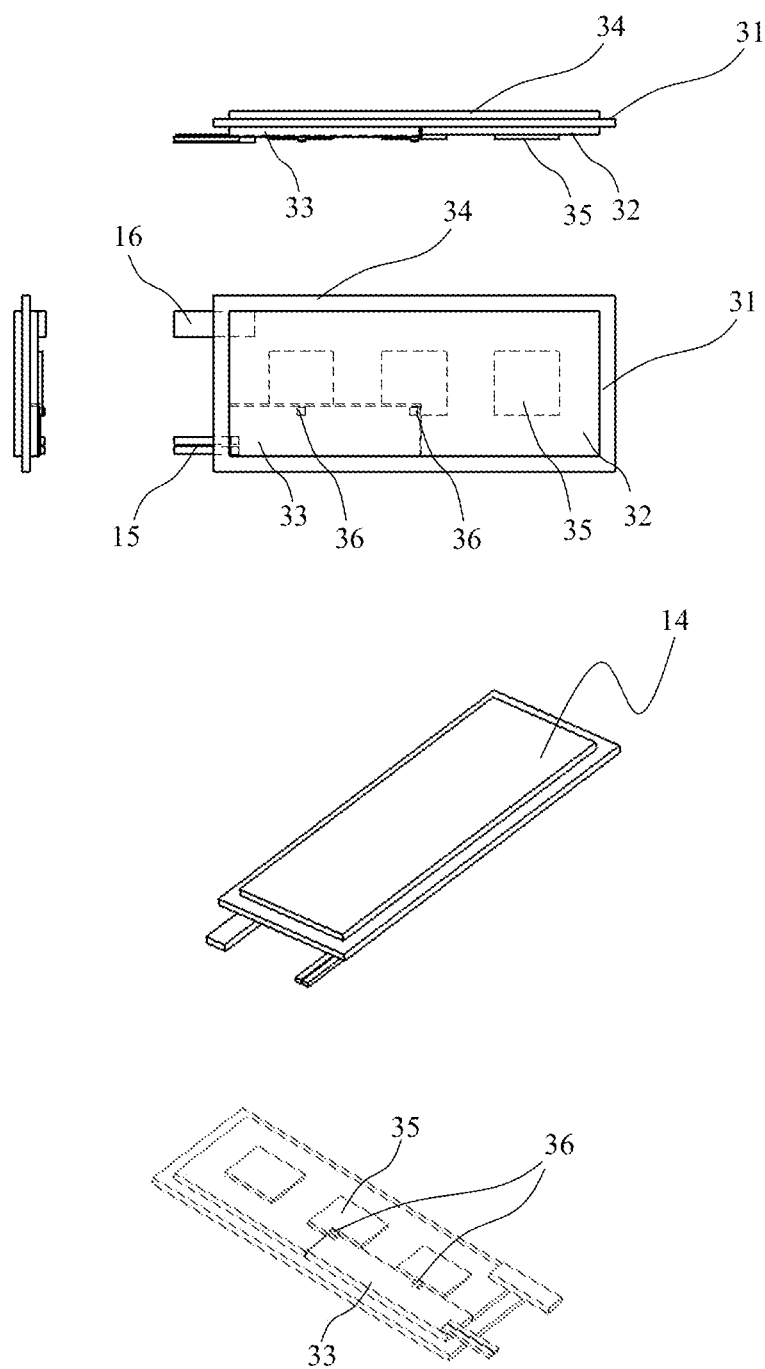
FIG. 3 is a configuration diagram of a second insulation substrate 14.

FIG. 3 is a configuration diagram of the second insulation substrate 14. The second insulation substrate 14 provided for the gate terminal includes an insulation layer 31. A heat dissipation layer 34 is located on a main surface of the insulation layer 34. A circuit layer 32 and an insulation wire 33 are located on another main surface of the insulation layer 31. The circuit layer is a metal layer. The insulation wire 33 is a wire layer provided for the gate terminal.

A ceramic material made of silicon nitride is employed as the insulation layer 31 in the embodiment 1. The reason therefor is same as that for the insulation layer 21. A same material as the insulation layer 21 in the first insulation substrate 13 is employed, thereby balancing overall thermal deformation of the semiconductor device 1. Other ceramics such as alumina or aluminum nitride may be employed depending on application or operating environment of the semiconductor device 1. Copper is used as the circuit layer 32, the heat dissipation layer 34, and the emitter terminal 16 for external leading. This is because copper is excellent in electrical conductivity and thermal conductivity. Other metal material such as aluminum may be employed depending on application or operating environment of the semiconductor device 1.

A protrusion 35, which works as a connection portion, is provided at a portion bonded with semiconductor chips. The protrusion 35 is provided for keeping a distance between the circuit layer 32 and peripheral portions of semiconductor chips when bonding semiconductor chips with the circuit layer 32, thereby ensuring pressure resistance. The protrusion 35 located at a portion opposing to the IGBT chip 11 is formed in U-shape so as to avoid a gate terminal of the IGBT chip 11. The diode chip 12 does not include gate terminal. Thus the protrusion 35 located at a portion opposing to the diode chip 12 is not formed in U-shape but in rectangle shape. The surface of the heat dissipation layer 34 has a smooth shape. This is for facilitating connection to cooling fin or the like when using the semiconductor device 1. On the other hand, the heat dissipation layer 34 itself may be used as a cooling fin by providing a fin on the surface of the heat dissipation layer 34. Although it is necessary to provide a fin in such case, there is no increase in thermal resistance due to connection members between the heat dissipation layer 34 and the cooling fin, thereby improving heat dissipation.

An insulation wire 33, which is provided for electrically connecting to gate terminal, is located at a portion opposing to the gate terminal of the IGBT chip 11. Low temperature sintered ceramic is employed as the insulation wire 33. A sheet formed by a ceramic material before sintered and a metal paste is stacked, and then the ceramic and the metal are simultaneously sintered at low temperature of at or below 1000 Celsius degree, thereby forming a ceramic insulator in which a metal wire layer is located inside the ceramic insulator. The embodiment 1 uses, as the low temperature sintered ceramic, a material in which three or more oxides are mixed having main components of magnesium, aluminum, and silicon. A material such as polycrystalline sintered body made by sintering these materials at 1000. Celsius degree is preferable, because the internal wire layer can be freely designed by forming a metal paste with printing technique and by stacking such metal. In addition, a protrusion 36 and the insulation wire 33 are formed. The protrusion 36 is provided for connecting with gate terminal. The insulation wire 33 is made of ceramic material in which a metal wire layer that electrically connects with the gate terminal 15 for external leading is included within the ceramic material. The protrusion 36 is provided on the wire surface located inside the ceramic material after sintering the low temperature sintered ceramic. The protrusion 36 for connecting with gate terminal is previously prepared, and is bonded with the wire surface by diffusion bonding. The protrusion 36 may be provided by other methods, such as by bonding the protrusion with bonding material or by plating the wire surface. In such cases, the protrusion 36 has an area size smaller than that of the protrusion 35, whereas having a height larger than that of the protrusion 36, so that the protrusion 36 is protruded more than the protrusion 35 toward the gate terminal of the IGBT chip 11.

Figure 4:
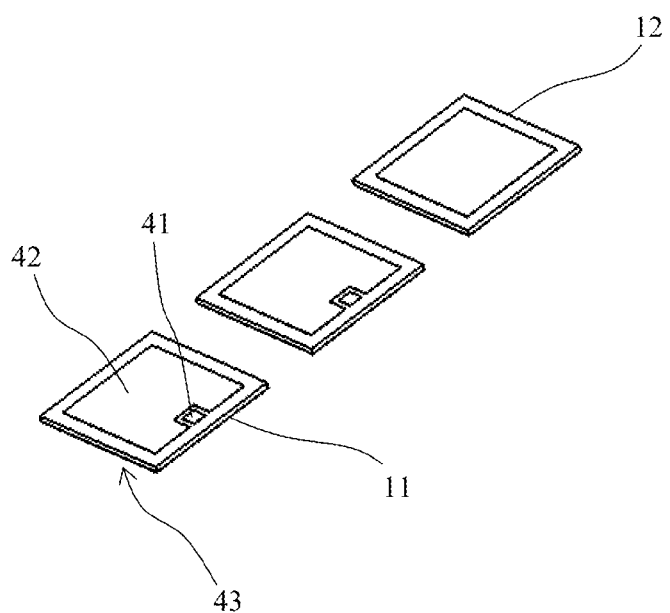
FIG. 4 is a configuration diagram of a semiconductor chip.

FIG. 4 is a configuration diagram of the semiconductor chip. A gate terminal 41 and an emitter terminal 42 are located on a front surface of the IGBT chip 11. The gate terminal 41 has an area size smaller than that of the emitter terminal 42. A collector terminal 43 is located on a back surface of the IGBT chip 11. The diode chip 12 does not include gate terminal. The gate terminal 41 of the chip front surface and the emitter terminal 42 of the chip front surface are located on the front surface of the IGBT chip 11. The gate terminal 41 of the chip front terminal has an area size smaller than that of the emitter terminal 42 of the chip front surface. The collector terminal 43 is located on the back surface of the IGBT chip 11. On the other hand, the diode chip 12 does not include gate terminal. A cathode terminal is located on a front surface of the diode chip 12, and an anode terminal is located on a back surface of the diode chip 12. Two IGBT chips 11 and a diode chip 12 are provided inside the semiconductor device 1 in this embodiment. However, the number of IGBT chip 11 or diode chip 12 may be modified. In addition, a MOS-FET chip may be employed instead of the IGBT chip 11. These chips may be selected depending on capacity or characteristics required for the semiconductor device 1.

Figure 5:
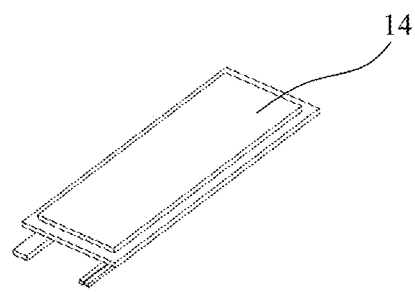
FIG. 5 is an exploded view of components of the semiconductor device 1.
Figure 5:
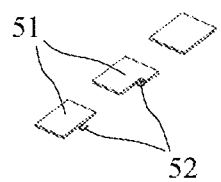
Figure 5:
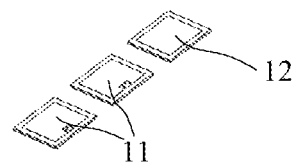
Figure 5:
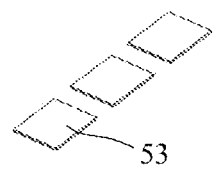
Figure 5:
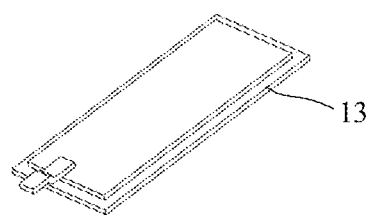

FIG. 5 is an exploded view of components of the semiconductor device 1. The diagram shows components other than the mold resin 18. The second insulation substrate 14 and the first insulation substrate 13 are placed at upper and lower positions respectively, and then the IGBT chip 11 and the diode chop 12 are placed between these substrates, thereby constructing the circuits of the semiconductor device 1. The emitter terminal 42 of the IGBT chip 12 and the emitter terminal of the diode chip 12 are connected with the second insulation substrate 14 by a bonding material 51. The gate terminal 41 is connected with the second insulation substrate 14 by a bonding material 52. The collector terminal 43 of the IGBT chip 11 and the collector terminal of the diode chip 12 are connected with the first insulation substrate 13 by a bonding material 53. This type of bonding scheme does not require bonding wires or the like. Thus it is possible to readily control circuit length or electrical resistance, thereby providing a circuit that is excellent in electrical characteristics.

The heat dissipation layer 34 of the second insulation substrate 14 and the heat dissipation layer 23 of the first insulation substrate 13 are placed at the upper and the lower surfaces of the semiconductor device 1, respectively. This allows efficient heat dissipation from both sides of the semiconductor device 1, thereby providing the semiconductor device 1 with excellent thermal dissipation of heat generated from the semiconductor chips during operation.

When projecting each of components of the semiconductor device 1 onto the main surface, the IGBT chip 11/the diode chip 12/the insulation wire 33 overlap with each other only at an area around the gate terminal 41 of the IGBT chip 11. Other areas of the IGBT chip 11 do not overlap with the insulation wire 33. The diode chip 12 does not overlap with the insulation wire 33 at all areas.

Copper, forming the circuit layer 32, has a thermal conductivity larger than that of low temperature sintered ceramic that forms the insulation wire 33. Therefore, the area size of the insulation wire 33 located at an area between each semiconductor chip and the heat dissipation layer 34 is made as small as possible, and the area size of the circuit layer 32 is made as large as possible, thereby improving heat dissipation. The insulation wire 33 is formed only around the gate terminal in the embodiment 1. Thus the area size of the circuit layer 32 is kept large, thereby increasing heat dissipation. In order to increase heat dissipation, it is effective to direct the heat generated from semiconductor chips toward the thickness direction, as well as diffusing the heat in the horizontal direction. In this embodiment, silicon nitride forming the insulation layer of insulation substrate placed on upper and lower of semiconductor chips has a thermal conductivity larger than that of copper forming the circuit layer 32. The heat diffusion in the horizontal direction is promoted by forming the thickness of the circuit layer 32 larger than that of the insulation layer.

Figure 6:
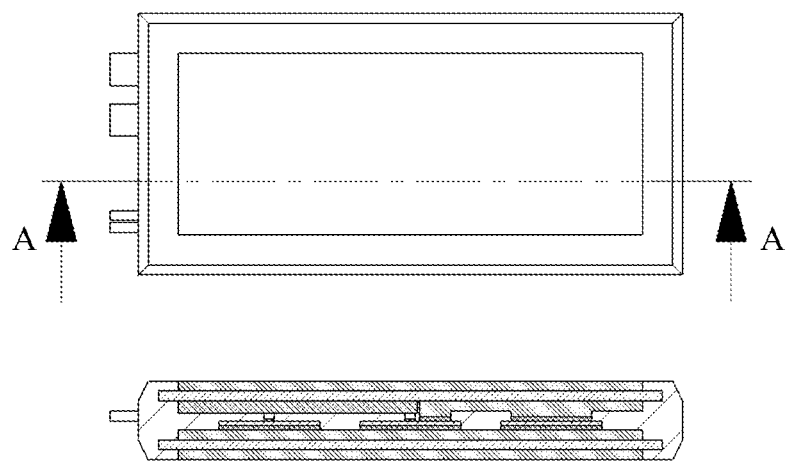
FIG. 6 is a sectional view of the semiconductor device 1.
Figure 6:
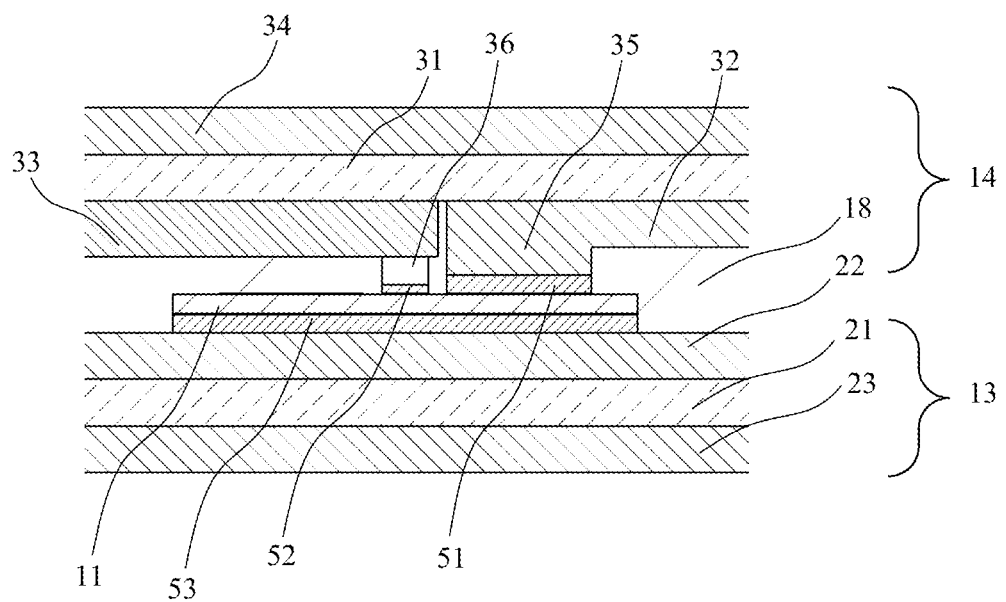

FIG. 6 is a sectional view of the semiconductor device 1. This diagram shows an expanded sectional view around the IGBT chip 11. As described with reference to FIG. 3, the protrusion 36, which protrudes from the insulation wire 33 for gate terminal toward semiconductor chips, has a height larger than that of the protrusion 35 for connecting of emitter circuit layer. In other words, toward the main surface of the insulation layer 31 of insulation substrate for emitter and gate terminals, the protrusion 36 for connecting gate terminal is protruded more than the end tip of the protrusion 35 for connecting of emitter circuit layer. Further in other words, the distance between the end tip of the protrusion 36 on the side of the IGBT chip 11 and the IGBT chip 11 is smaller than that between the end tip of the protrusion 35 on the side of the IGBT chip 11 and the IGBT chip 11. The bonding materials 51 and 52 are placed between each protrusion (protrusions 35 and 36) and the IGBT chip 11. As described in manufacturing method below, the thicknesses of the bonding materials 51 and 52 are same with each other. However, the protruding feature of the protrusion 36 for connecting gate terminal presses the bonding material 52 more than the bonding material 51 in the manufacturing process. Thus the manufactured bonding material 52 is thinner than the manufactured bonding material 51. In this way, the bonding material 52 is pressed more than the bonding material 51 in the manufacturing process, thereby ensuring conductivity of gate terminals to improve reliability of connection.

Figure 7A:
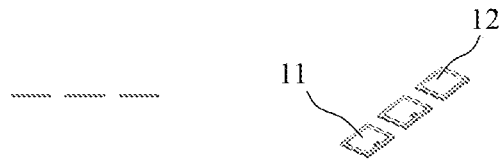
FIGS. 7A-G are a diagram illustrating a method for manufacturing the semiconductor device 1.

FIGS. 7A-G are a diagram illustrating a method for manufacturing the semiconductor device 1. In an initial state, no processing is applied to the IGBT chip 11 and to the diode chip 12 (FIG. 7A).

Figure 7B:
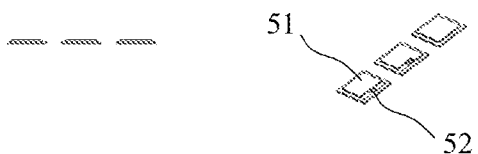

FIG. 7B shows a process applying bonding materials. In the embodiment 1, the bonding materials are applied on the surfaces of the IGBT chip 11 and the diode chip 12, firstly. Among soldering materials having main component of Sn, a material having main component of Sn and Cu with high melting temperature is employed as the bonding materials 51 and 52. A flux-like solder containing volatile components is applied on the surfaces of each semiconductor chip using masks. The bonding materials 51 and 52 are positioned so that the gate terminal 41 of the IGBT chip 11 does not short with the emitter terminal 42. When applying the bonding material using masks, if the thicknesses of the bonding materials are different from each other, it is necessary to perform the application of bonding material multiple times using complicated masks. Thus in the embodiment 1, the applied bonding materials have same thickness, so that the bonding materials are applied by one application process using one mask for each of semiconductor chip.

Figure 7C:
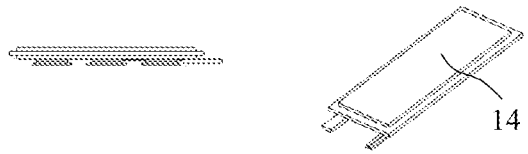

FIG. 7C shows a process bonding the semiconductor chip with the second insulation substrate 14. The positions of the second insulation substrate 14 and of the semiconductor chips are aligned using a carbon jig. Each member is bonded by melting the bonding materials 51 and 52 using reflow machine and then curing the bonding materials. The carbon jig is separated into upper and lower jigs. An upper surface of the lower jig has a pin for aligning with the upper jig and a recess for aligning the insulation substrate 14 for emitter and gate terminals. The upper jig has a hole through which the pin of the lower jig passes and a hole penetrating upper and lower surfaces for aligning each semiconductor chip. In the manufacturing process: the insulation substrate 14 for emitter and gate terminals is placed to the recess of lower jig so that the dissipation layer 34 is placed lower; then the lower and the upper jigs are aligned using the pin of lower jig and the hole of upper jig; then each semiconductor chip is placed from the hole of upper jig for aligning each semiconductor chip so that the applied bonding materials 51 and 52 are placed lower. In this state, each member is bonded by the reflow machine, thereby bonding each semiconductor chip with the insulation substrate 14 for emitter and gate terminals. The height of protrusion 36 is larger than that of protrusion 35. Therefore, as long as the thicknesses of the bonding materials 51 and 52 are same with each other, the inclination of semiconductor chip in the bonding process or dimensional tolerance of each member are ignored and the bonding material 52 is pressed more than the bonding material 51, thereby ensuring connection of the gate terminal. Thus the semiconductor device 1 is provided with high reliability.

Figure 7D:
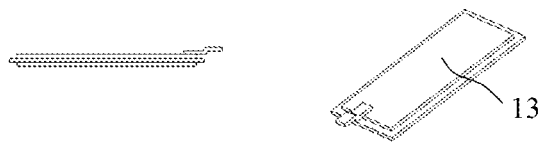
Figure 7E:
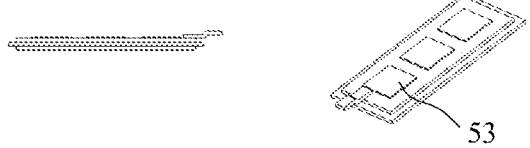

FIG. 7D shows a surface of the first insulation substrate 13 on the side of the circuit layer 22. FIG. 7E shows a process applying the bonding material 53 on the surface of the circuit layer 22. A soldering material having main component of Sn is employed as the bonding material 53. A paste-like soldering material is applied using masks. A soldering material having main components of Sn, Ag, and Cu with melting temperature lower than that of the bonding materials 51 and 52 is employed as the bonding material 53.

Figure 7F:
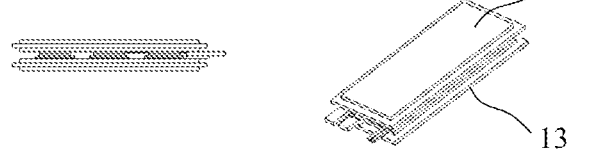

FIG. 7F shows a process bonding the first insulation substrate 13 (after bonding semiconductor chips) with the second insulation substrate 14. The first insulation substrate 13 and the second insulation substrate 14 are aligned using a carbon jig. Each substrate is bonded by melting the bonding material 53 using reflow machine and then curing the bonding material. The melting temperature of the bonding material 53 is lower than that of the bonding materials 51 and 52. Thus it is possible to prevent the bonding materials 51 and 52 from melting again in the reflow process. Although a difference is made between melting temperatures using the amount of Ag included in the bonding material, the melting temperature may be controlled using additive materials such as Bi or In.

Figure 7G:
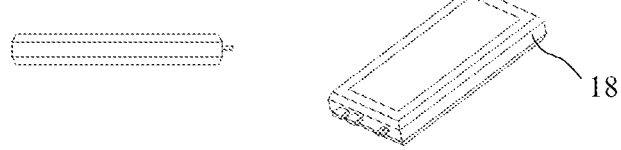

FIG. 7G shows a process sealing the device by the mold resin 18. This process completes the manufacturing process of the semiconductor device 1. In this process, firstly, the bonding material is applied to the gate and emitter terminals of the semiconductor chip. Then the semiconductor chip and the insulation substrate for emitter and gate terminals are bonded simultaneously using the bonding material. Then the semiconductor chip is bonded with the insulation substrate for collector terminal. This manufacturing process firstly connects the gate terminal to ensure conductivity of the gate terminal having small area size, and then bonds the emitter and the gate terminals simultaneously, thereby simplifying the manufacturing process.

Embodiment 1: Summary

In the semiconductor device 1 according to the embodiment 1, the protrusion 36 is protruded more than the protrusion 35 toward the IGBT chip 11 from the insulation wire 33 formed by ceramic material and wire layer. Accordingly, it is possible to ensure conductivity between the gate terminal with small area size and the wire layer.

In the semiconductor device 1 according to the embodiment 1, the insulation wire 33 with small thermal conductivity is placed only around the gate terminal, thereby keeping the area size of the circuit layer 32 having large thermal conductivity. Accordingly, it is possible to ensure sufficient heat dissipation.

Embodiment 2

Figure 8:
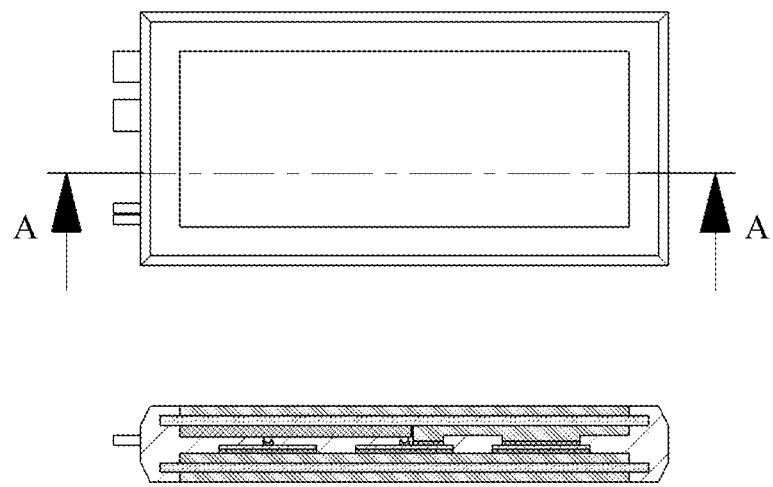
FIG. 8 is a sectional view of the semiconductor device 1 according to an embodiment 2.
Figure 8:
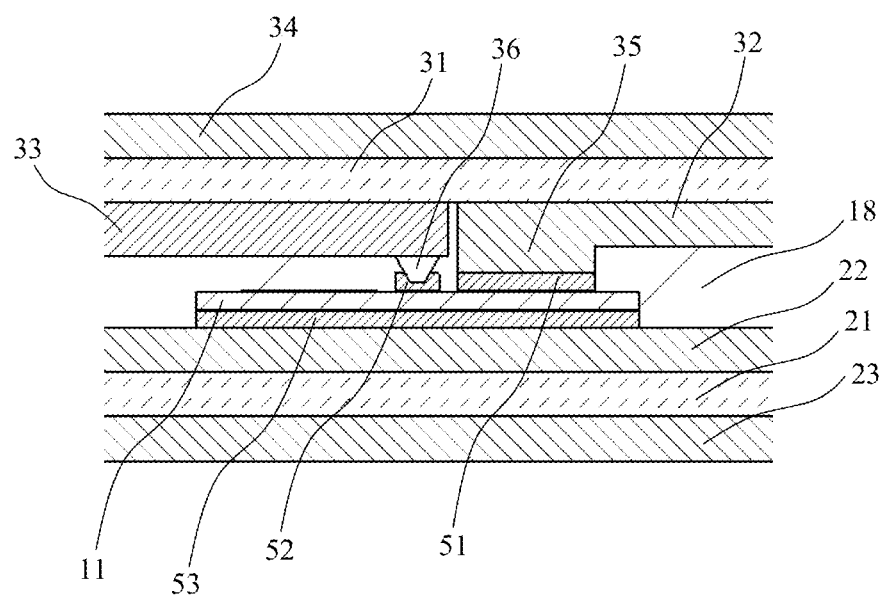

FIG. 8 is a sectional view of the semiconductor device 1 according to an embodiment 2 of the present disclosure. The protrusion 36 is tapered toward the end tip (the edge portion on the side closer to the IGBT chip 11). Other configurations are same as in the embodiment 1. Since the protrusion 36 is tapered in the embodiment 2, the protrusion 36 proceeds into the bonding material 52 when the bonding material 52 is softened in the reflow process, thereby further ensuring connection of the gate terminal. Note that the protrusion 36 for connecting gate terminal is previously prepared, and is bonded with the wire surface by diffusion bonding. The protrusion may be provided by other methods, such as by bonding the protrusion with bonding material or by plating the wire surface.

Embodiment 3

Figure 9:
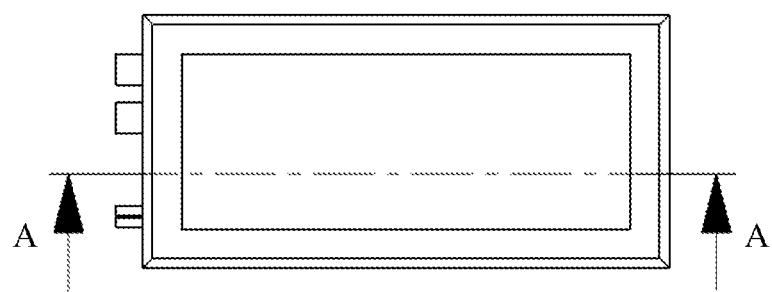
FIG. 9 is a sectional view of the semiconductor device 1 according to an embodiment 3.
Figure 9:
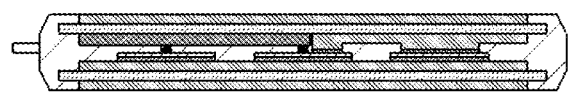
Figure 9:
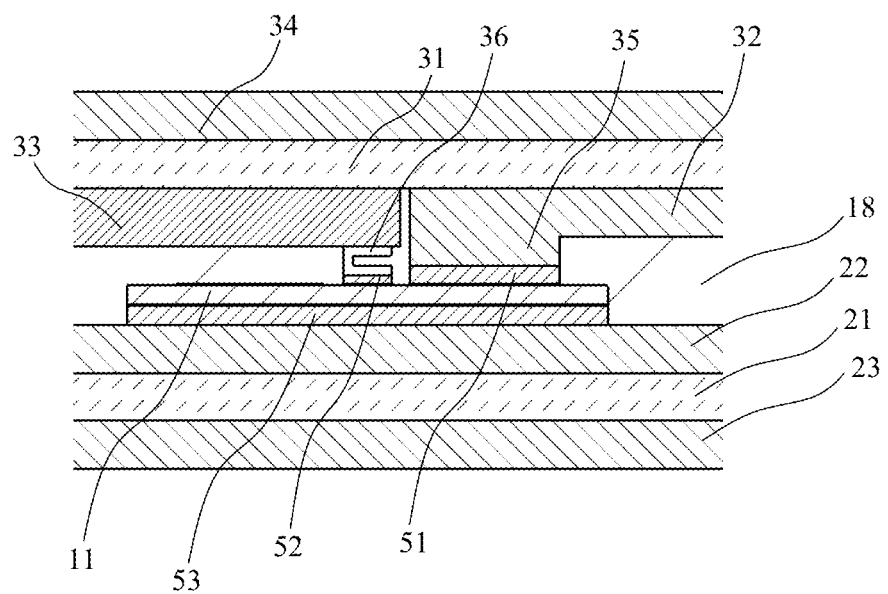

FIG. 9 is a sectional view of the semiconductor device 1 according to an embodiment 3 of the present disclosure. In the embodiment 3, the protrusion 36 has a bend structure and has stiffness in the height direction smaller than that of the embodiment 1. Other configurations are same as in the embodiment 1. When connecting the protrusion 36 with the gate terminal, if the surface of the IGBT chip 11 is extremely pressed by the protrusion 36, there arises a risk of electrodes on the surface of the IGBT chip 11 or internal semiconductors being damaged. By reducing the stiffness of the protrusion 36 in the height direction, it is possible to certainly prevent from extremely pressing the electrode on the surface of the IGBT chip 11 and internal semiconductors, thereby providing the semiconductor device 1 with higher reliability.

In the embodiment 3, instead of or in addition to the bend structure, the stiffness in the height direction may be reduced by other structures such as spring shape or zigzag shape. Alternatively, the stiffness in the height direction may be reduced using a material of small longitudinal elastic modulus as the protrusion 36. One of these schemes may be selected depending on the manufacturing method or manufacturing process of the protrusion 36.

Embodiment 4

Figure 10:
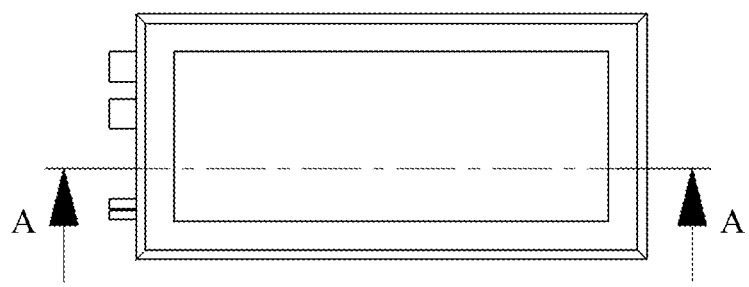
FIG. 10 is a sectional view of the semiconductor device 1 according to an embodiment 4.
Figure 10:
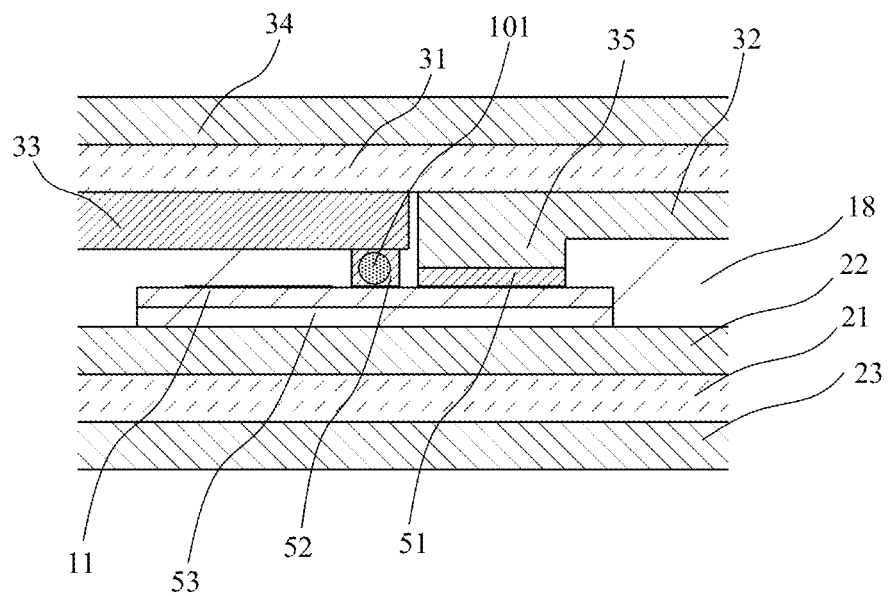

FIG. 10 is a sectional view of the semiconductor device 1 according to an embodiment 4 of the present disclosure. In the embodiment 4, instead of the protrusion 36, a core material 101 with approximately spherical shape is placed within the bonding material 52. Other configurations are same as in the embodiment 1. A copper core ball is employed as the core material 101, which is made by plating nickel on the surface of copper ball, and then by plating Sn on the nickel plating. In the embodiment 4, at least a part of the core material 101 is placed at a position closer to the IGBT chip 11 than the protrusion 35. Accordingly, it is possible to ensure connection between the gate terminal 41 and the wire layer.

In the manufacturing process, when the bonding material 52 is melted and cured by the reflow machine, the Sn plating on the surface of the core material 101 is melted and cured to ensure conductivity to the gate terminal 41. On the other hand, copper or nickel forming the core material 101 does no melt. Therefore, it is possible to ensure the connection between the insulation wire 33 and the IGBT chip 11.

Although the embodiment 4 employs the core material 101 with approximately spherical shape, other shapes may be employed as long as the functionality above is achieved, such as polygonal shape or granular crushed shape. In addition, as long as having resistance against high temperature of the reflow process, other materials may be employed as the core material 101 such as a ball made of polyimide. These materials may be selected depending on the manufacturing method or manufacturing process of the core material 101.

Embodiment 5

Figure 11:
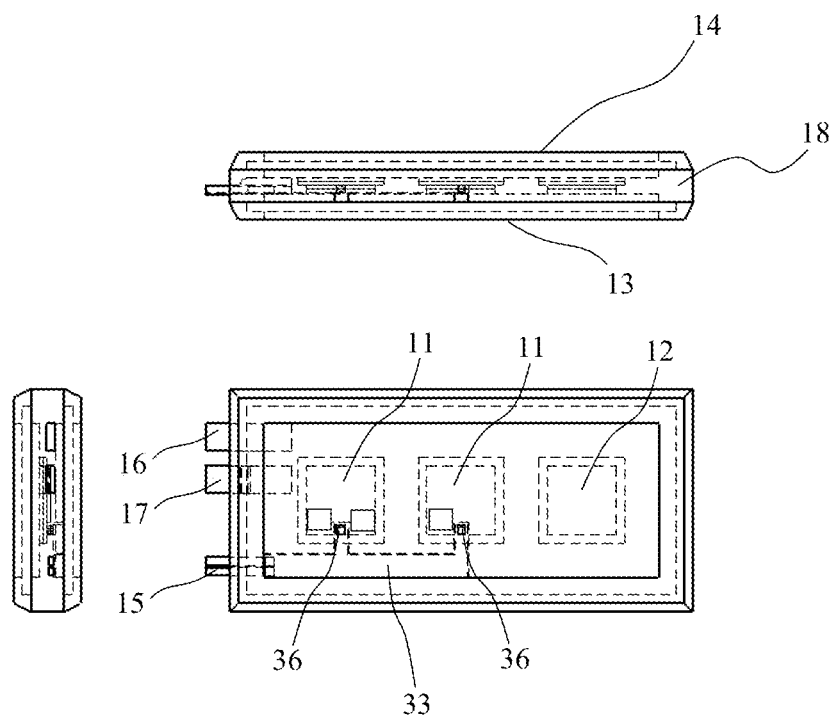
FIG. 11 is an overall configuration diagram of the semiconductor device 1 according to an embodiment 5.
Figure 11:
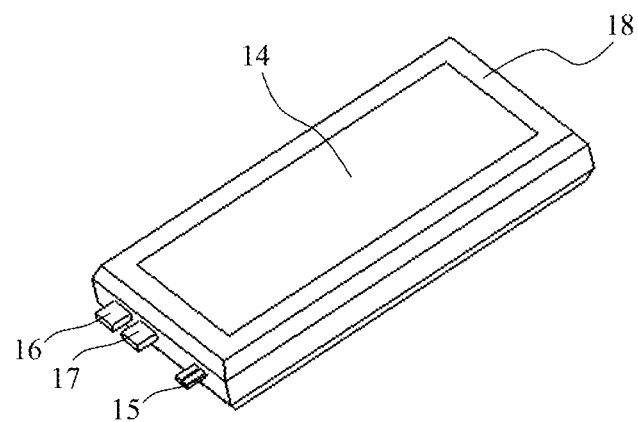

FIG. 11 is an overall configuration diagram of the semiconductor device 1 according to an embodiment 5 of the present disclosure. The insulation wire 33 is approximately rectangular in the embodiment 1. On the other hand, the insulation wire 33 in the embodiment 5 has a shape branched toward each of the protrusions 36 (i.e. each of the gate terminals) respectively.

In the embodiment 5, when projecting each component of the semiconductor device 1 onto the main surface, the insulation wire 33 and the IGBT chip 11 overlap with each other only around the gate terminal 41. Accordingly, it is possible to connect whole surface of the emitter terminal 42 with the protrusion 35. Comparing to low temperature sintered ceramic that forms the insulation wire 33, copper that forms the protrusion 35 has larger thermal conductivity. Therefore, the area size where the IGBT chip 11 is bonded with the protrusion 35 is increased as in the embodiment 5, thereby efficiently cooling the semiconductor device 1. IGBT is employed as the switching element in this embodiment. If MOS-FET is employed as the switching element, the insulation wire 33 for gate terminal overlaps with the MOS-FET chip only around the gate terminal.

In the embodiment 5, the insulation wire 33 has a complicated shape of branch. Therefore, it is necessary to collectively manufacture a plurality of the insulation wires 33 for gate terminal, and then to cut off the insulation wire 33 by dicing or the like. Thus the difficulty of the manufacturing process is increased. On the other hand, the insulation wire 33 may be manufactured by manufacturing methods other than that of the embodiment 1, such as cutting the green sheet before sintering the ceramic material and then sintering it. One of the embodiments may be selected depending on these manufacturing methods and on cooling capacity required for the semiconductor device 1.

<Modification of the Present Invention>

The present invention is not limited to the foregoing embodiments but includes various modification examples. For example, the foregoing embodiments have been described in detail to facilitate understanding of the present invention, and the present invention is not limited to one including all of the components described herein. Also, some components of one embodiment can be substituted with components of another embodiment, and components of another embodiment can be added to components of one embodiment. Further, some components of each embodiment can be added, deleted, and substituted with other components.

In the embodiments above, an example is described where two IGBT chips 11 and a diode chip 12 is provided inside the semiconductor device 1. The number of IGBT chip 11 or diode chip 12 may be modified. A MOS-FET (Metal-Oxide-Semiconductor Field-Effect Transistor) chip may be employed instead of the IGBT chip 11. These parameters may be selected depending on capacity or characteristics required for the semiconductor device 1.

REFERENCE SIGNS LIST

1: semiconductor device
11: IGBT chip
12: diode chip
13: first insulation substrate
14: second insulation substrate
15: gate terminal
16: emitter terminal
17: collector terminal
18; mold resin
21: insulation layer of the first insulation substrate
22: circuit layer of the first insulation substrate
23: heat dissipation layer of the first insulation substrate
31: insulation layer of the second insulation substrate
32: circuit layer of the second insulation substrate
33: insulation wire
34: heat dissipation layer of the second insulation substrate
35: protrusion
36: protrusion
41: gate terminal
42: emitter terminal
43: collector terminal
51: bonding material
52: bonding material
53: bonding material
101: core material

The invention claimed is:

1. A semiconductor device that includes a semiconductor switching element, comprising:
   a first insulation substrate on which the semiconductor switching element is implemented; and
   a second insulation substrate including an insulation layer and also including a wire layer and a metal layer on one surface of the insulation layer,
   wherein the one surface of the insulation layer and a surface of the first insulation substrate on which the semiconductor switching element is implemented are opposing to each other,
   wherein the wire layer is formed inside a ceramic layer formed on the one surface of the insulation layer,
   wherein a gate terminal of the semiconductor switching element and the wire layer are electrically connected with each other via a connection portion formed by a conductive material and via a first bonding material,
   wherein a terminal of the semiconductor switching element other than the gate terminal and the metal layer are electrically connected with each other via a second bonding material,
   wherein a distance from the one surface of the insulation layer to an edge of the connection portion on a side of the first insulation substrate is larger than a distance from the one surface of the insulation layer to a surface of the metal layer on a side of the first insulation substrate,
   wherein the semiconductor switching element is a IGBT or a MOSFET,
   wherein the ceramic layer is formed at a position overlapping with a gate terminal of the semiconductor switching element assuming that the first and the second insulation substrates are projected onto an opposing plane, and wherein the metal layer is placed at a position not overlapping with the ceramic layer and overlapping with an emitter terminal of the semiconductor switching element assuming that the first and the second insulation substrates are projected onto an opposing plane.

2. The semiconductor device according to claim 1, wherein the connection portion is formed as a protrusion that is protruded from the wire layer toward the gate terminal.

3. The semiconductor device according to claim 2, wherein the connection portion has a shape tapered from the insulation layer toward the gate terminal.

4. The semiconductor device according to claim 2, wherein the connection portion has a spring structure.

5. The semiconductor device according to claim 1, wherein the connection portion is formed as a core that is placed within the first bonding material.

6. The semiconductor device according to claim 1, wherein a diode chip is implemented on the first insulation substrate, and
wherein the ceramic layer is formed at a position overlapping with the semiconductor switching element and not overlapping with the diode chip assuming that the first and the second insulation substrates are projected onto an opposing plane.

7. The semiconductor device according to claim 1, wherein the first insulation substrate includes a heat dissipation layer on a surface on which the semiconductor switching element is not implemented, and
wherein the second insulation substrate includes a heat dissipation layer on another surface that does not include the wire layer and the metal layer.

8. The semiconductor device according to claim 1, wherein the semiconductor switching element is a IGBT or a MOSFET, wherein the first insulation substrate includes a metal layer on a surface on which the semiconductor switching element is implemented, and wherein the metal layer of the first insulation substrate is electrically connected with a collector terminal of the semiconductor switching element.

9. The semiconductor device according to claim 1, wherein a plurality of the semiconductor switching elements is implemented on the first insulation substrate, wherein the wire layer has a rectangular planar shape, and
wherein the wire layer is formed at a position overlapping with gate terminals of each of the semiconductor switching elements assuming that the first and the second insulation substrates are projected onto an opposing plane.

10. The semiconductor device according to claim 1, wherein a plurality of the semiconductor switching elements is implemented on the first insulation substrate, and
wherein the wire layer has a shape branching toward gate terminals of each of the semiconductor switching elements.

11. A method for manufacturing the semiconductor device according to claim 1,
wherein the semiconductor switching element is a IGBT or a MOSFET,
the method comprising:
applying the first bonding material onto a gate and emitter terminals of the semiconductor switching element,
bonding the semiconductor switching element and the second insulation substrate simultaneously using the first bonding material, and
bonding the semiconductor switching element with the first insulation substrate.

12. The method according to claim 11, further comprising forming the ceramic layer by sintering a ceramic material at or below 1000 Celsius degree.

* * * * *